United States Patent [19]
Park et al.

[11] Patent Number: 5,973,362
[45] Date of Patent: Oct. 26, 1999

[54] SEMICONDUCTOR DEVICE AND METHOD FOR FABRICATING THE SAME

[75] Inventors: Min Wha Park; Hae Chang Yang, both of Chungcheongbuk-do, Rep. of Korea

[73] Assignee: LG Semicon, Co., Ltd., Chungcheongbuk-do, Rep. of Korea

[21] Appl. No.: 08/951,511

[22] Filed: Oct. 16, 1997

[30] Foreign Application Priority Data

Apr. 21, 1997 [KR] Rep. of Korea ....................... 97/14682

[51] Int. Cl.⁶ ............................. H01L 29/68; H01L 29/78
[52] U.S. Cl. ........................ 257/344; 257/387; 257/401; 257/408
[58] Field of Search .................................. 257/344, 401, 257/336, 346, 387, 408

[56] References Cited

U.S. PATENT DOCUMENTS

| | | | |
|---|---|---|---|
| 5,276,344 | 1/1994 | Arima et al. | 257/336 |
| 5,436,482 | 7/1995 | Ogoh | 257/344 |
| 5,780,911 | 7/1998 | Park et al. | 257/401 |
| 5,789,780 | 8/1998 | Fulford, Jr. et al. | 257/344 |

*Primary Examiner*—Donald L. Monin, Jr.

[57] ABSTRACT

A semiconductor device which is applied to access transistors of an SRAM cell to improve its operation performance and a method for fabricating the same are disclosed. The semiconductor device includes a gate insulating layer formed on a semiconductor substrate, a gate electrode formed on the gate insulating layer, lightly doped impurity regions having different lengths beneath surface of the semiconductor substrate at first and second sides of the gate electrode, and heavily doped impurity regions formed beneath the surface of the semiconductor substrate, extending from the lightly doped impurity regions.

8 Claims, 4 Drawing Sheets

SEMICONDUCTOR DEVICE AND METHOD FOR FABRICATING THE SAME

BACKGROUND OF THE INVENTION

1. Field of the Invention

The present invention relates to a semiconductor device and, more particularly, to a semiconductor device which is applied to access transistors of an SRAM cell to improve its operation performance and a method for fabricating the same.

2. Discussion of the Related Art

A conventional semiconductor device will be described with reference to the attached drawings. FIG. 2 is a plan view of a conventional semiconductor device and FIG. 3 is a cross-sectional view showing a structure of a conventional semiconductor device.

As shown in FIGS. 2 and 3, a field region and an active region are defined in a semiconductor substrate 1 and a field oxide layer 2 is formed on the field region. A gate electrode 4 having a gate oxide layer 3 is formed on the active region. A sidewall spacer 7 having a predetermined thickness is formed on both sides of the gate electrode 4. Lightly doped impurity regions 6 are formed beneath surface of the semiconductor substrate 1 both sides of the gate electrode 4. Source and drain regions 8 are formed beneath the surface of the semiconductor substrate 1, but not under the gate electrode 4 and the sidewall spacer 7.

When a semiconductor device having the foregoing structure is applied to access transistors of an SRAM cell, the operation will be described in detail with reference to FIG. 1.

The operation of writing a data "1" in a first cell node CN1 will be described. When 5 V is applied to a word line, first and second access transistors TA1 and TA2 are turned on. Subsequently, 5 V is applied to a bitline and another 5 V is applied to a bit bar line. Accordingly, data "1" and "0" are written in the first cell node CN1 and the second cell node CN2, respectively. Thus, a second drive transistor TD2 is turned on and a first drive transistor TD1 off.

The operation of reading a data "0" in the SRAM cell will be described. First of all, 5 V is applied to each of the bitline and the bit bar line. At this time, there is no current flow along the first access transistor TA1 between the bitline and the first cell node CN1 in which data "1" has been written. In contrast, current flows from the bit bar line to the second cell node CN2 along the second access transistor TA2 due to voltage difference between the bit bar line and the second cell node CN2 in which data "0" has been written. At this time, the current flowing along the second access transistor TA2 flows along the second drive transistor abruptly so that the low data written in the second cell node CN2 comes to being read.

However, the conventional, aforementioned semiconductor device has problems. When a conventional semiconductor device is applied to access transistors of an SRAM cell, on reading data "0" stored in a cell node, the current driving power of access transistors is increased and thus current flows to a second drive transistor to read data "0". As a result, the total current driving ratio is declined so that data "0" can not be exactly read, Whereby the performance of the SRAM cell becomes inferior.

SUMMARY OF THE INVENTION

Therefore, the present invention is directed to a semiconductor device and a method for fabricating the same that substantially obviate one or more of problems due to limitations and disadvantages of the related art.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a semiconductor device includes a gate insulating layer formed on a semiconductor substrate, a gate electrode formed on the gate insulating layer, lightly doped impurity regions having different lengths beneath surface of the semiconductor substrate at first and second sides of the gate electrode, and heavily doped impurity regions formed beneath the surface of the semiconductor substrate, extending from the lightly doped impurity regions.

In another aspect of the invention, a method for fabricating a semiconductor device includes the steps of providing a semiconductor substrate where an active region is defined, forming a gate electrode having a recess on a predetermined area of the active region to have a gate insulating layer between the gate electrode and the semiconductor substrate, forming lightly doped impurity regions in the active region at both sides of the gate electrode with the gate electrode serving as a mask, forming a sidewall spacer on both sides of the gate electrode, and forming heavily doped impurity regions in the active region with the sidewall spacer serving as a mask.

It is to be understood that both the foregoing general description and the following detailed description are exemplary and explanatory and are intended to provide further explanation of the invention as claimed.

BRIEF DESCRIPTION OF THE DRAWINGS

These and various other objects, features, and advantages of the present invention will be readily understood with reference to the following detailed description read in conjunction with the accompanying drawings, in which.

DETAILED DESCRIPTION OF THE PREFERRED EMBODIMENTS

Reference will now be made in detail to the preferred embodiments of the present invention, examples of which are illustrated in the accompanying drawings.

Figure 4:
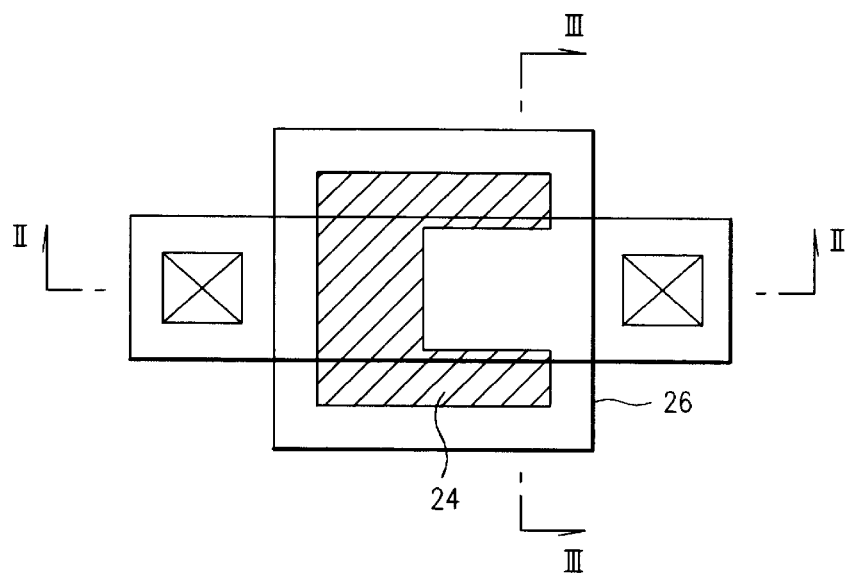
FIG. 4 is a plan view of a semiconductor device according to the present invention.
Figure 5:
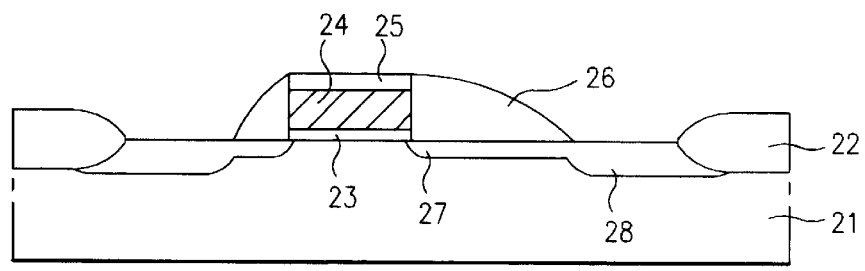
FIG. 5 is a cross-sectional view showing a structure of the semiconductor device, taken along line II—II of FIG. 4.
Figure 7:
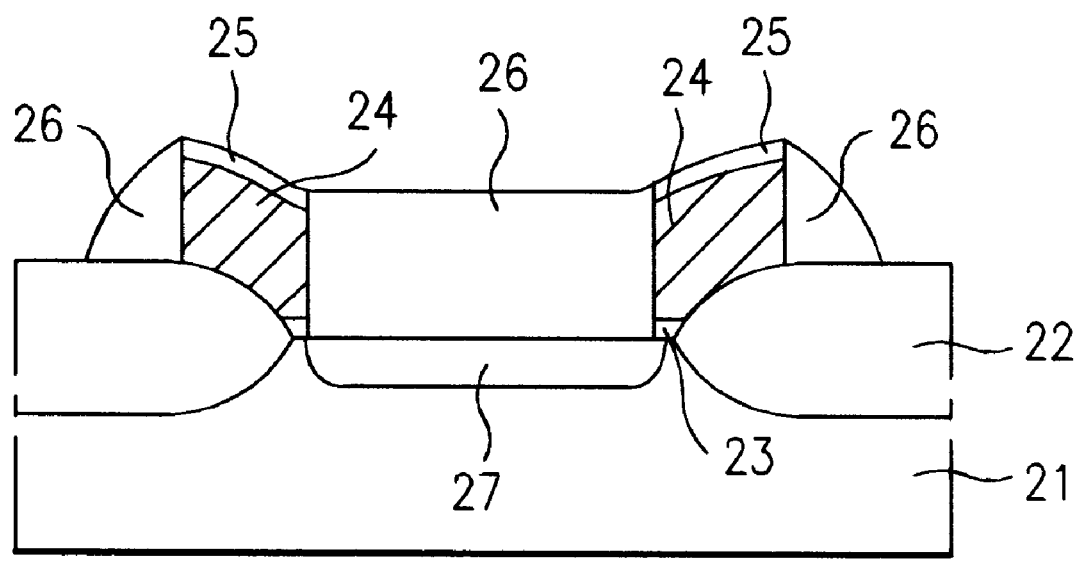
FIG. 7 is a cross-sectional view showing a structure of the semiconductor device, taken along line III—III of FIG. 4.

FIG. 4 is a plan view of a semiconductor device, FIG. 5 is a cross-sectional view of the semiconductor device, taken along line II—II of FIG. 4, and FIG. 7 is a cross-sectional view of the semiconductor device, taken along line III—III of FIG. 4.

As shown in FIGS. 4, 5, and 7, an active region and a field region are defined in a semiconductor substrate 21, and a field oxide layer 22 is formed on the field region. A gate electrode 24 having a gate oxide layer 23 is formed on the active region. The gate electrode 24 has a recess therein. Sidewall spacers 26 is formed to have different widths in asymmetry, filled the recess of the gate electrode 24. Lightly doped impurity regions 27 having different length beneath the sidewall spacers 26 are formed at both sides of the gate electrode 24. Source and drain regions 28 are formed on the active region at sides of the sidewall spacers 26. The width of the recess is less than half of the width of the sidewall spacers 26 and an identical height with the gate electrode 24. The gate oxide layer 23 is exposed at the bottom of the recess.

A method for fabricating the foregoing semiconductor device will be described in detail. FIGS. 6A to 6D are cross-sectional views showing process steps of the method.

Figure 6A:
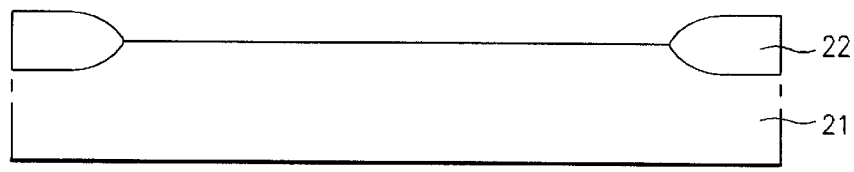
FIGS. 6A to 6D are cross-sectional views showing process steps of a semiconductor device according to a preferred embodiment of the present invention.

Referring initially to FIG. 6A, an active region and a field region are defined in a semiconductor substrate 21, and a field oxide layer 22 is formed on the field region by a local oxidation process.

Figure 6B:
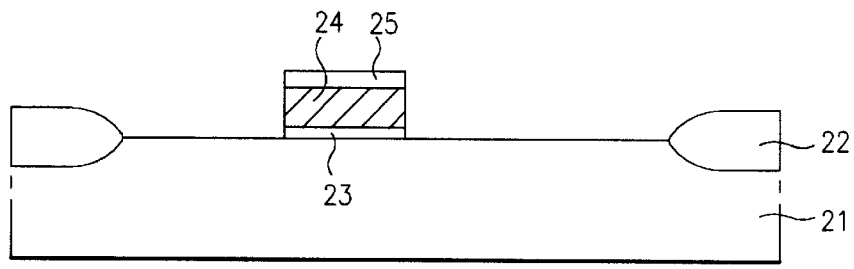

Referring to FIG. 6B, a first oxide layer, a polysilicon layer, and an insulating layer are successively formed on the entire surface of the semiconductor substrate 21 and then anisotropically etched by a photo etching process by using a mask for gate electrode formation, thereby forming a gate oxide layer 23, a gate electrode 24, and a gate cap insulating layer 25. At this time, the gate electrode 24 has a recess therein. The recess has a height of as high as the gate electrode 24. Also there remains none of the gate oxide layer 23 at the bottom of the recess.

Figure 6C:
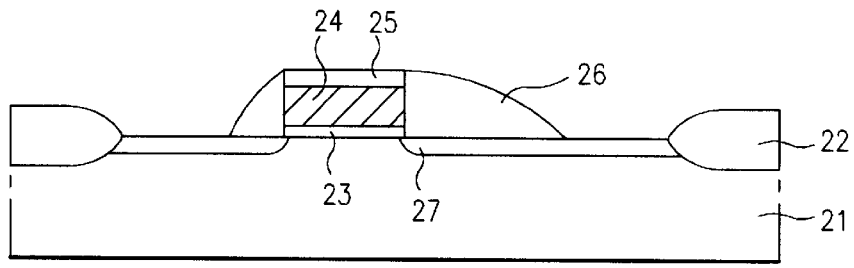

Referring to FIG. 6C, with the gate electrode 24 serving as a mask, lightly doped impurity ions of an n-type are implanted to the substrate 21 at both sides of the gate electrode 24 so as to form lightly doped impurity regions 27. Next, a second oxide layer is deposited on the semiconductor substrate 21 and then anisotropically etched to form a sidewall spacer 26 on both sides of the gate electrode 24. At this time, the second oxide layer is formed to be higher than half the height of the recess. The second oxide layer fills the recess of the gate electrode 24 and the sidewall spacer 26 formed at the recess is longer than that formed at the other side of the gate electrode 24. Thus, the lightly doped impurity region 27 formed at the recess is longer than that at the other side of the gate electrode 24.

Figure 6D:
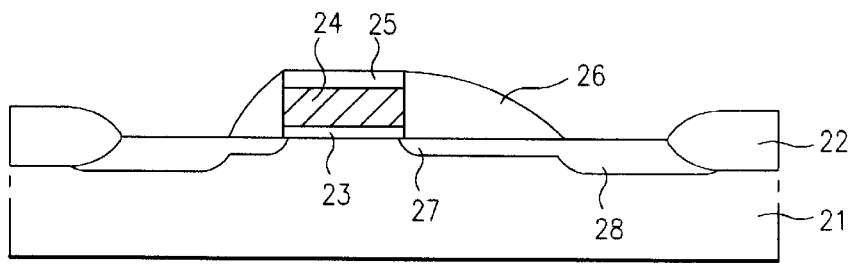

Referring to FIG. 6D, with the gate electrode 24 and the sidewall spacers 26 serving as masks, n-type heavily doped impurity ions are implanted to form source and drain regions 28 beneath the surface of the semiconductor substrate 21 at sides of the sidewall spacer 26.

Figure 1:
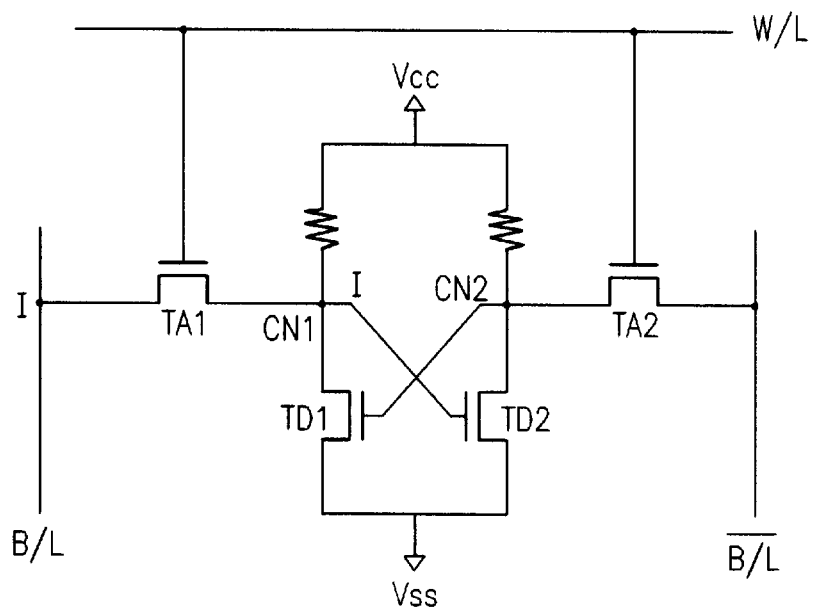
FIG. 1 is a circuit diagram of a general SRAM cell.
Figure 2:
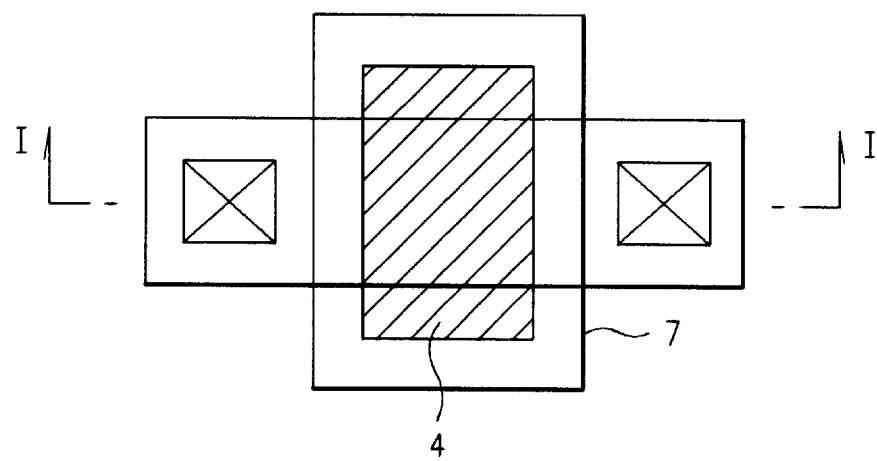
FIG. 2 is a plan view of a conventional semiconductor device.
Figure 3:
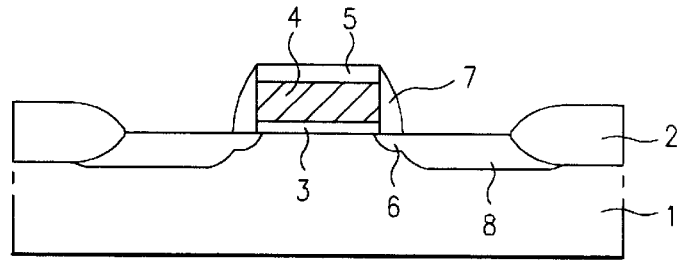
FIG. 3 is a cross-sectional view showing a structure of the semiconductor device, taken along line I—I of FIG. 2.

The operation of the semiconductor device which is applied to access transistors of an SRAM cell will be described in FIG. 1.

First, the operation of writing data "1" in a first node cell CN1 will be described. First, 5 V is applied to a word line to turn on first and second access transistors. Another 5 V is applied to a bitline and 0 V to a bit bar line, so as to turn on the a second drive transistor TD2 and turn off a first drive transistor TD2. Accordingly, data "1" is written in the first cell node CN1 and data "0" is written in the second cell node CN2.

The operation of reading data "0" stored in the second cell node CN2 will be described. First, 5 V is applied to the word line to turn on the first and second access transistors TA1 and TA2. 5 V is applied to each of the bitline and the bit bar line. Accordingly, there is no current flow along the first access transistor TA1 between the bit line and the first cell node CN1.

In contrast, voltage difference between the bit bar line and the second cell node CN2 due to data "0" stored in the second cell node CN2, and thus current flows from the bit bar line to the second cell node CN2 through the second access transistor TA2. At this time, if the semiconductor device is applied to the second access transistor TA2, the lightly doped impurity region 27 connected to the second cell node CN2 is longer than the lightly doped impurity region 27 at the second access transistor TA2 connected to the bit bar line. The lightly doped impurity regions 27 function as resistors so that current can be prevented from flowing to the second drive transistor abruptly.

The semiconductor device and the fabricating method thereof have the following advantages. When the semiconductor device of the present invention is applied to access transistors of an SRAM cell, on reading data "0", current driving rate of the access transistors is declined by a lightly doped impurity region having a long cell node and thus current can be prevented from abruptly flowing to the drive transistor of an SRAM cell. Accordingly, the SRAM cell has low voltage so that it has better performance for read operation.

It will be apparent to those skilled in the art that various modification and variations can be made in the semiconductor device and the fabricating method thereof of the present invention without departing from the spirit or scope of the inventions. Thus, it is intended that the present invention cover the modifications aid variations of this invention provided they come within the scope of the appended claims and their equivalents.

What is claimed is:

1. A semiconductor device comprising:
    a gate insulating layer formed on a semiconductor substrate;
    a gate electrode formed on the gate insulating layer, the gate electrode having first and second sides and a recess in the first side;
    lightly doped impurity regions having different lengths beneath surface of the semiconductor substrate at the first and second sides of the gate electrode; and
    heavily dopes impurity regions formed beneath the surface of the semiconductor substrate, extending from the lightly dopes impurity regions.

2. The semiconductor device as claimed in claim 1, wherein the lightly doped impurity regions have different lengths at the recess of the gate electrode and at the second side of the gate electrode.

3. The semiconductor device as claimed in claim 1, wherein said device is asymmetrical along the direction defined by the sidewall spacers and is symmetrical in the orthogonal direction.

4. A semiconductor device comprising:
    a gate insulating layer formed on a semiconductor substrate;
    a gate electrode formed on the gate insulating layer, the gate electrode having first and second sides and a recess in the first side;
    a first and second sidewall spacers having different widths formed on the first and second sides of the gate electrode on the semiconductor substrates;
    lightly doped impurity regions formed beneath surface of the semiconductor substrate, corresponding to the sidewall spacers; and heavily doped impurity regions formed beneath the surface of the semiconductor substrate, extending from the lightly doped impurity regions.

5. The semiconductor device as claimed in claim 4, wherein said device is asymmetrical along the direction defined by the sidewall spacers and is symmetrical in the orthogonal direction.

6. A semiconductor device comprising:

a gate insulating layer formed on a semiconductor substrate;

a gate electrode formed on the gate insulating layer, the gate electrode having first and second sides and a recess in the first side;

a first and second sidewall spacers having different widths formed on the semiconductor substrate at the first side and the second side of the gate electrode to fill the recess of the gate electrode;

lightly doped impurity regions formed beneath surface of the semiconductor substrate, corresponding to the sidewall spacers; and heavily doped impurity regions formed beneath the surface of the semiconductor substrate, extending from the lightly doped impurity regions.

7. The semiconductor device as claimed in claim 6, wherein the width of the recess, as measured in the direction defined by the sidewall spacers, is less than the half of the distance of the end points of the sidewall spacers.

8. The semiconductor device as claimed in claim 6, wherein said device is asymmetrical along the direction defined by the sidewall spacers and is symmetrical in the orthogonal direction.

* * * * *